(12) United States Patent
Charbuillet et al.

(10) Patent No.: US 7,608,867 B2
(45) Date of Patent: Oct. 27, 2009

(54) VERTICAL IMOS TRANSISTOR HAVING A PIN DIODE FORMED WITHIN

(75) Inventors: Clément Charbuillet, Chambery (FR); Thomas Skotnicki, Crolles-Monfort (FR); Alexandre Villaret, Grenoble (FR)

(73) Assignee: STMicroelectronics Crolles 2 SAS, Crolles (FR)

( * ) Notice: Subject to any disclaimer, the term of this patent is extended or adjusted under 35 U.S.C. 154(b) by 7 days.

(21) Appl. No.: 11/393,616

(22) Filed: Mar. 30, 2006

(65) Prior Publication Data

US 2006/0220086 A1 Oct. 5, 2006

(30) Foreign Application Priority Data

Mar. 30, 2005 (FR) .................................. 05 50816

(51) Int. Cl.
  *H01L 29/94* (2006.01)
  *H01L 29/868* (2006.01)
(52) U.S. Cl. ................. 257/288; 257/104; 257/109; 257/117; 257/302; 257/E27.039
(58) Field of Classification Search ................. 257/213, 257/288, 296, 350, 104, 109, 117, E27.039
See application file for complete search history.

(56) References Cited

U.S. PATENT DOCUMENTS

| 5,920,088 A * | 7/1999 | Augusto ..................... 257/192 |
| 6,239,472 B1 * | 5/2001 | Shenoy ....................... 257/408 |
| 6,511,884 B1 | 1/2003 | Quek et al. |
| 2001/0053569 A1 * | 12/2001 | Skotnicki et al. ............. 438/142 |
| 2002/0163027 A1 | 11/2002 | Skotnicki et al. |
| 2003/0006431 A1 * | 1/2003 | Skotnicki et al. ............. 257/200 |
| 2004/0016968 A1 * | 1/2004 | Coronel et al. ............... 257/347 |
| 2004/0262690 A1 * | 12/2004 | Coronel et al. ............... 257/365 |
| 2006/0113612 A1 * | 6/2006 | Gopalakrishnan et al. ... 257/392 |

FOREIGN PATENT DOCUMENTS

DE    199 43 390 A1    5/2001

OTHER PUBLICATIONS

French Search Report from French Patent Application 05/50816, filed Mar. 30, 2005.
Hansch W. et al. "A vertical MOS-gated Esaki tunneling transistor in silicon" Thin Solid Films, Elsevier-Sequoia S.A, Lausanne, CH, vol. 369, No. 1-2, Jul. 2002 pp. 387-389, XP004200396.
Schulze J. et al. "Vertical MOS-gated pin-diodes" MOS-gated tunneling transistors in Si(100) and Si(111) Thin Solid Films< Elsevier_Sequois S.A. Lausanne, CH, vol. 380, No. 1-2, Dec. 22, 2000, pp. 154-157 XP004226621.

\* cited by examiner

*Primary Examiner*—Lynne A. Gurley
*Assistant Examiner*—Vernon P Webb
(74) *Attorney, Agent, or Firm*—Lisa K. Jorgenson; James H. Morris; Wolf, Greenfield & Sacks, P.C.

(57) ABSTRACT

A vertical IMOS-type transistor including: a stack of a first semiconductor portion doped with dopant elements of a first type, of a second substantially undoped intrinsic semiconductor portion, and of a third semiconductor portion doped with dopant elements of a second type forming a PIN-type diode; and a conductive gate placed against the stack with an interposed insulating layer.

9 Claims, 9 Drawing Sheets

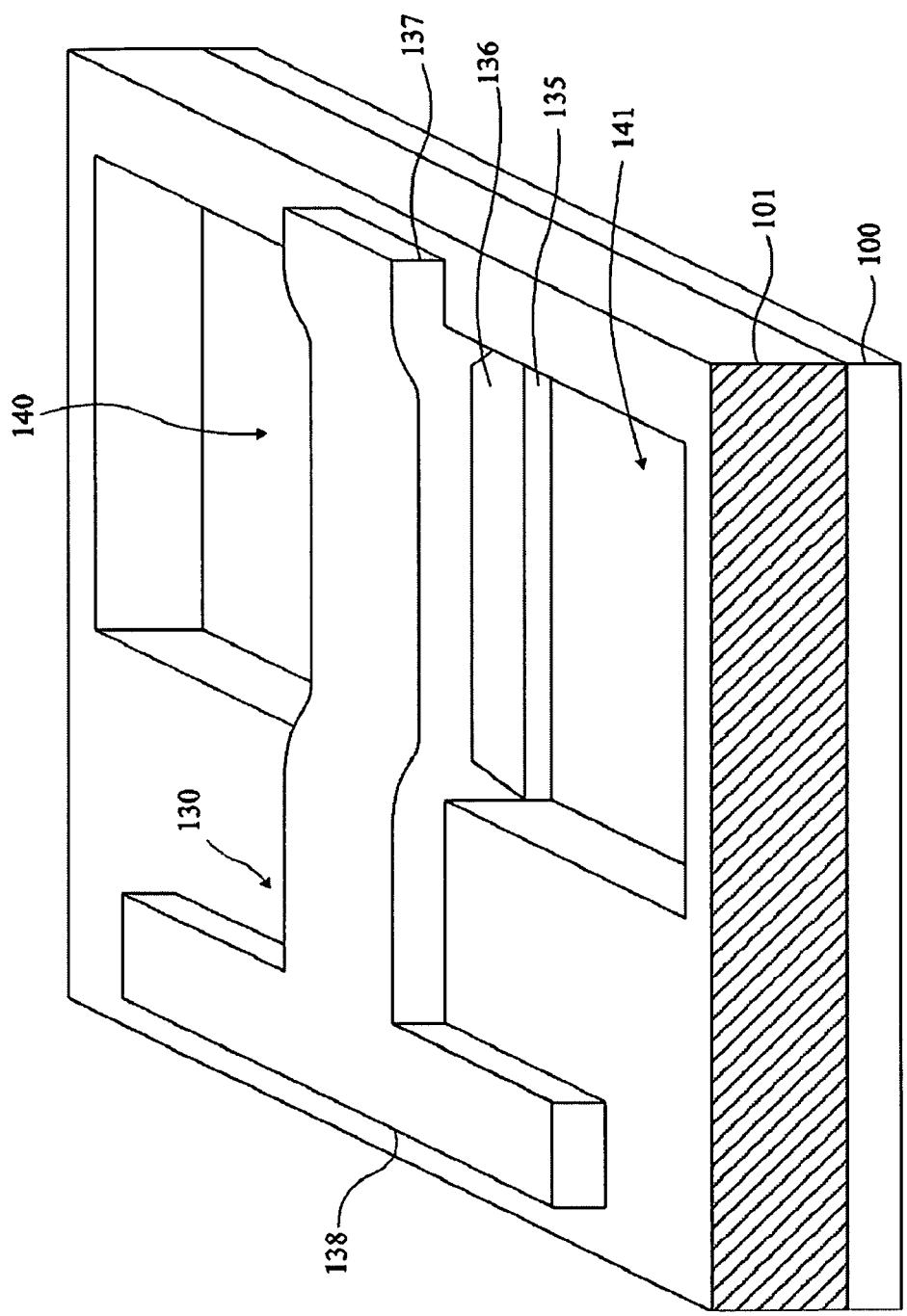

VERTICAL IMOS TRANSISTOR HAVING A PIN DIODE FORMED WITHIN

BACKGROUND OF THE INVENTION

1. Field of the Invention

The present invention relates to an IMOS transistor, IMOS standing for Impact Ionization Metal Oxide Semiconductor.

2. Discussion of the Related Art

FIG. 1 is a perspective view of an IMOS-type transistor formed in an SOI-type (Silicon-On-Insulator) wafer. The SOI wafer comprises a support 1, a thin insulating layer 2, and a semiconductor layer 3. An insulating layer 5 formed in through openings of semiconductor 3 surrounds a so-called "active" area 6 of semiconductor layer 3.

A lateral strip 10 of active area 6, shown to the left of the drawing, is doped with P-type elements. Another lateral strip 11, shown to the right of the drawing, is doped with N-type elements. A central strip 12 of active area 6, undoped or intrinsic I, is placed between lateral strips 10 and 11. The right-hand portion of central strip 12 is covered with a stacking of a thin insulating layer 15 and of a conductive layer 16.

FIG. 2 is a cross-section view of the structure shown in FIG. 1. P-type lateral strip 10 is connected to a source terminal S. N-type lateral strip 11 is connected to a drain terminal D. Conductive layer 16 is connected to a gate terminal G. The operation of this transistor is close to that of a reverse diode, the breakdown voltage of which can be varied. The diode in question is the PIN diode formed by strips 10 to 12. When the voltage of gate G increases with respect to that of central intrinsic strip 12, an N-type area 20 creates under thin insulating layer 15. This results in bringing P-type strip 10 "closer" to N-type strip 11 and thus in decreasing the reverse breakdown voltage of the PIN diode.

FIG. 3 is a diagram illustrating the variations of drain-source current $i_{DS}$ crossing the diode according to voltage Vg on gate terminal G. Current $i_{DS}$ is substantially zero for voltages Vg smaller than a threshold voltage Vt and substantially equal to a current imax when voltage Vg is greater than threshold voltage Vt. The drain-source voltage of a conventional MOS transistor according to its gate voltage is shown in dotted lines. As visible in FIG. 3, the increase in current $i_{DS}$ along with the gate voltage is much more progressive for a MOS transistor than for an IMOS transistor. IMOS-type transistors exhibit a smaller static power consumption than MOS transistors. Further, IMOS-type transistors are capable of switching, that is, of passing from the non-conductive state to the conductive state, within a very short time shorter than or equal to that of a conventional MOS transistor.

Further, a conventional method for forming an IMOS transistor such as that shown in FIG. 1 is to form the gate, that is, layers 15 and 16, then to perform a first implantation step for forming lateral N-type strip 11 and a second implantation step for forming lateral P-type strip 10. On forming of lateral N-type strip 11, it is necessary to mask the exposed portion of semiconductor layer 3 placed to the left of the gate. The opening of the mask formed above the area which is desired to be implanted, say the right-hand portion of the semiconductor layer, should not be shifted to leftwards by a distance greater than the width of its gate to avoid implanting the portion of semiconductor layer 3 placed to the left of gate 15/16. Now, current photolithography devices used for the manufacturing of integrated circuits do not enable aligning such an opening with an accuracy greater than 40/50 nm. The gate width of IMOS transistors can thus not be provided to be smaller than 50 nm. Now, it is possible to manufacture conventional MOS transistors exhibiting smaller gate widths. Accordingly, for an identical current capacity, an IMOS-type transistor such as that shown in FIG. 1 may be much more bulky than a conventional MOS transistor.

SUMMARY OF THE INVENTION

An object of the present invention is to provide an IMOS-type transistor of low bulk.

To achieve this and other objects, the present invention provides a vertical IMOS-type transistor comprising: a conductive access area placed in a upper part of a substrate and surrounded with an insulating area; a stack of a first semiconductor portion doped with dopant elements of a first type, of a second substantially undoped intrinsic semiconductor portion, and of a third semiconductor portion doped with dopant elements of a second type forming a PIN-type diode, the stack being placed on the conductive access area, said third portion being placed on the top of the stack and partly extending above said insulating area; and a conductive gate placed against said stack with an interposed insulating layer.

According to an alternative embodiment of the previously-described transistor, contacts enabling access to the third portion are placed on the extension thereof, above said insulating area.

According to an alternative embodiment of the previously-described transistor, the substrate is a semiconductor wafer or an upper semiconductor layer of an SOI wafer.

According to an alternative embodiment of the previously-described transistor, said gate is formed of at least one gate spacer.

According to an alternative embodiment of the previously-described transistor, the transistor further comprises at least one contact placed above a portion of said access area.

According to an alternative embodiment of the previously-described transistor, said access area has a substantially rectangular shape, said third portion is formed of first and second strips forming a T, a first strip being placed above the access area, transversely thereto, so that in top view two portions of the access area are placed on either side of this first strip, first strip extending over said insulating area, the second strip being placed above said insulating area against one end of the first strip, first gate spacers being placed against said stack above said conductive access area and second gate spacers being placed against parts of the third portion placed above insulating area, and further comprising a third conductive strip surrounding said first strip and laterally extending above the insulating area, the third strip being in contact with said second gate spacers.

According to an alternative embodiment of the previously-described transistor, said conductive gate does not extend from the bottom to the top of said stack, the gate being placed against all or part of the second intrinsic semiconductor portion and possibly extending against all or part of one of the first and third doped semiconductor portions.

The present invention further provides a vertical IMOS transistor comprising the steps of: forming, at the surface of a semiconductor substrate, an insulating area which surrounds an area of the substrate called the lower area doped with dopant elements of a first type; forming an intrinsic semiconductor block above the lower area; forming a semiconductor layer doped with dopant elements of a second type which covers the intrinsic block and the insulating area; anisotropically etching the semiconductor layer, the intrinsic block, and the surface portion of said lower area whereby a stack of a "lower" portion doped with elements of the first type, of an intrinsic portion, and of an upper semiconductor portion doped with dopant elements of the second type is formed, the upper semiconductor portion extending above said insulating area; conformally depositing a thin insulating layer); conformally depositing a conductive layer; and anisotropically etching the conductive layer and the thin insulating layer, whereby conductive spacers are formed against said stacking and against the sides of the parts of the upper portion placed above the insulating area and a conductive block is formed in contact with spacers placed above said insulating layer.

According to an alternative embodiment of the previously-described method, the method further comprises the steps of: depositing an insulating layer above the previously-obtained structure; etching the insulating layer to form openings above the conductive block, the upper semiconductor portion, and the portions of the lower area uncovered with said lower semiconductor portion; and filling the openings with a conductive material to form contacts.

According to an alternative embodiment of the previously-described method, the method further comprises the steps of: performing a conformal deposition of a second insulating layer; performing an anisotropic etching of the second insulating layer, with, as a result, the forming of insulating spacers against said conductive spacers; depositing a second conductive layer on the previously-obtained structure; having the second conductive layer react with the upper semiconductor portion, the conductive block, and the exposed areas of the lower area, to form silicided areas at the surface of these elements; and eliminating the remaining portions of the second conductive layer.

The foregoing object, features, and advantages of the present invention, as well as others, will be discussed in detail in the following non-limiting description of specific embodiments in connection with the accompanying drawings.

DETAILED DESCRIPTION

Figure 1:
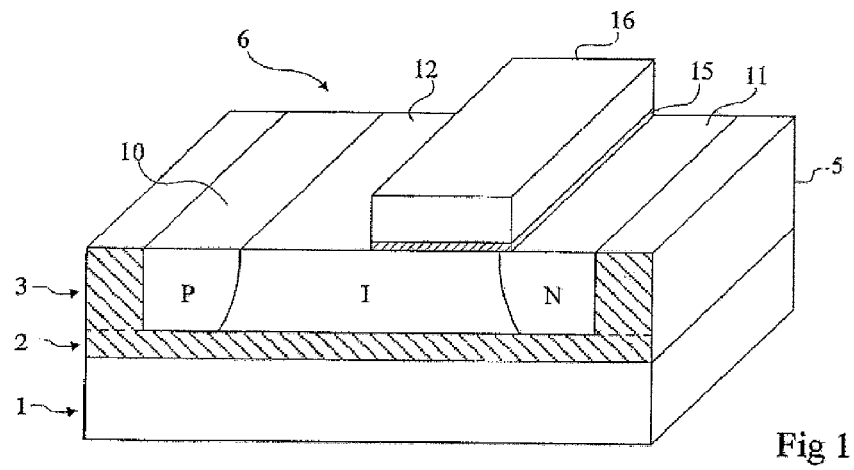
FIG. 1 is a perspective view, previously described, of a known IMOS-type transistor.
Figure 2:
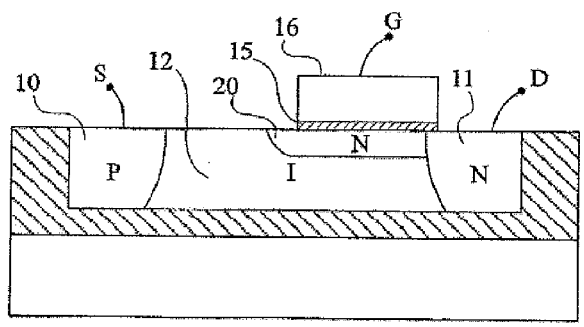
FIG. 2 is a cross-section view of the transistor shown in FIG. 1.
Figure 3:
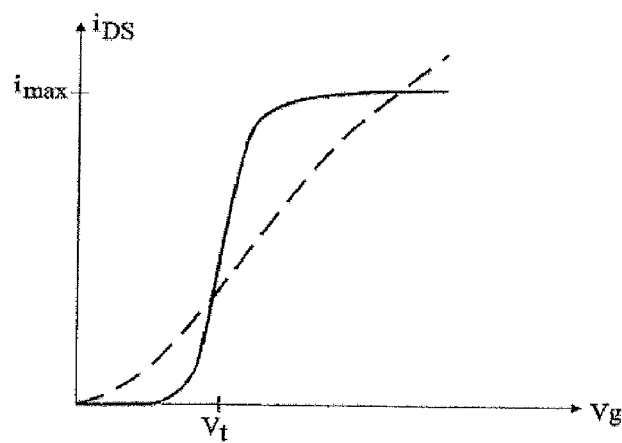
FIG. 3 is a diagram illustrating the current of an IMOS transistor according to the voltage applied on its gate.

For clarity, the same elements have been designated with the same reference numerals in the different drawings and, further, as usual in the representation of integrated circuits, FIGS. 1, 2, and 4 to 14 have been drawn out of scale.

The present invention aims at a vertical-conduction IMOS transistor conversely to the previously-described horizontal-conduction transistor. Successive steps of manufacturing of an example of such a transistor are described hereafter in relation with FIGS. 4 to 13.

Figure 4A:
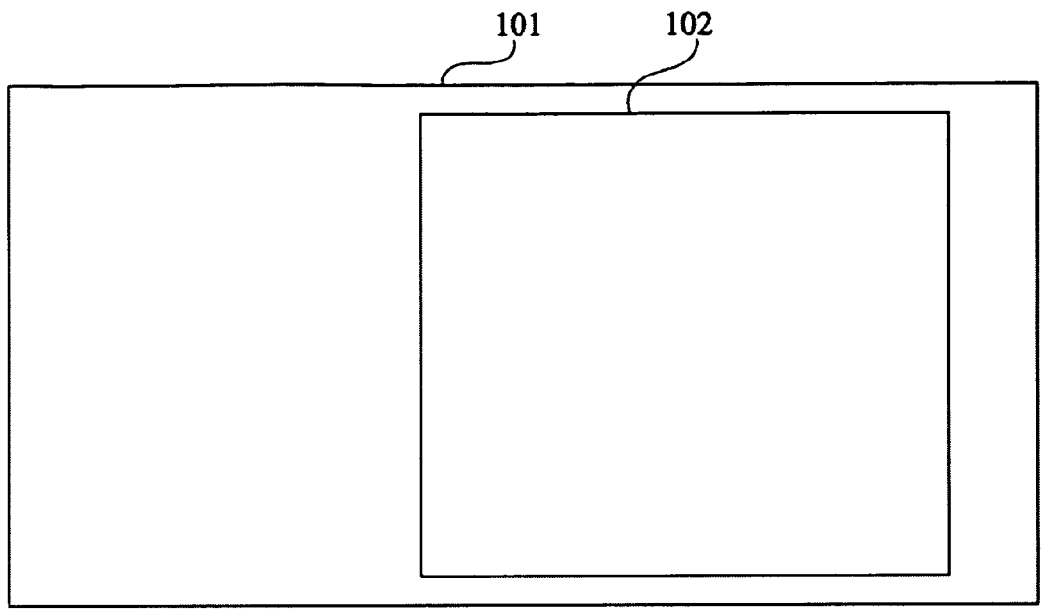
FIGS. 4 to 14 are top views, cross-section views, or perspective views of structures obtained at the end of successive steps of a method for manufacturing an IMOS transistor according to the present invention.
Figure 4B:
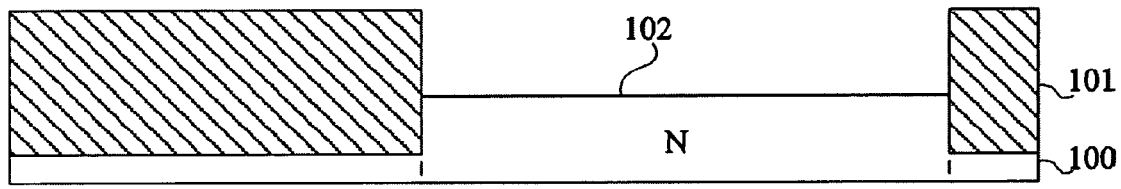

In an initial step, illustrated in top view in FIG. 4A and in cross-section view in FIG. 4B, an insulating area 101 which surrounds a so-called active area 102 of substrate 100 is formed at the surface of a substrate 100. Active area 102 has in this example a substantially rectangular shape and is placed to the right of the drawing. In this example, insulating area 101 is placed in a recess formed at the surface of substrate 100. The lower surface of insulating area 101 is lower than the lower surface of active area 102 and the upper surface of the insulating area is higher than that of active area 102.

An ion implantation is then performed to dope active area 102 with N-type elements in this example.

Figure 5:
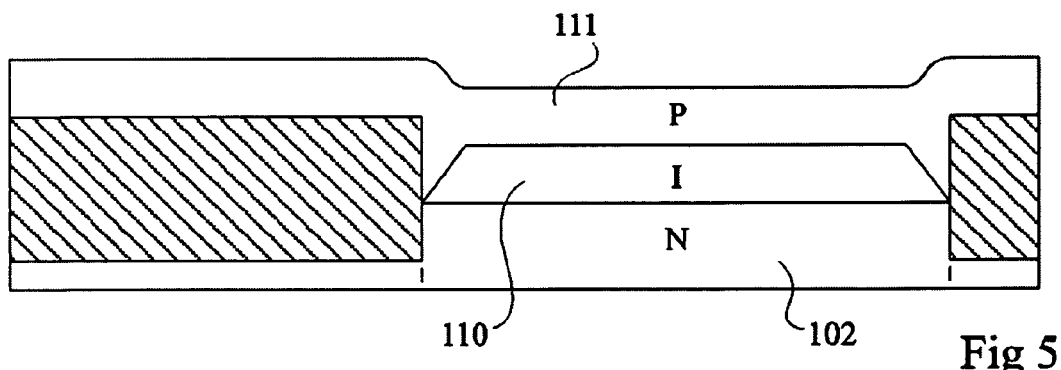

In a next step, illustrated in cross-section view in FIG. 5, an "intrinsic", that is, undoped, semiconductor block I 110 is grown by a selective method above active area 102. As visible in FIG. 5, an epitaxial growth of the semiconductor block may result in the forming of a block exhibiting slanted walls which are in contact with insulating area 101 at the surface of active area 102 and which draw away therefrom by moving away from active area 102.

A semiconductor, for example P-type, doped layer 111 is then grown by a non-selective method above intrinsic block 110 and insulating area 101. The doping of semiconductor layer 111 is preferably performed on forming thereof and not by a subsequent implantation to preserve the "non-doping" of intrinsic portion 110. Generally, it is considered in the present description that a semiconductor area is intrinsic if it is not or little doped comparatively with the so-called doped areas.

Figure 6A:
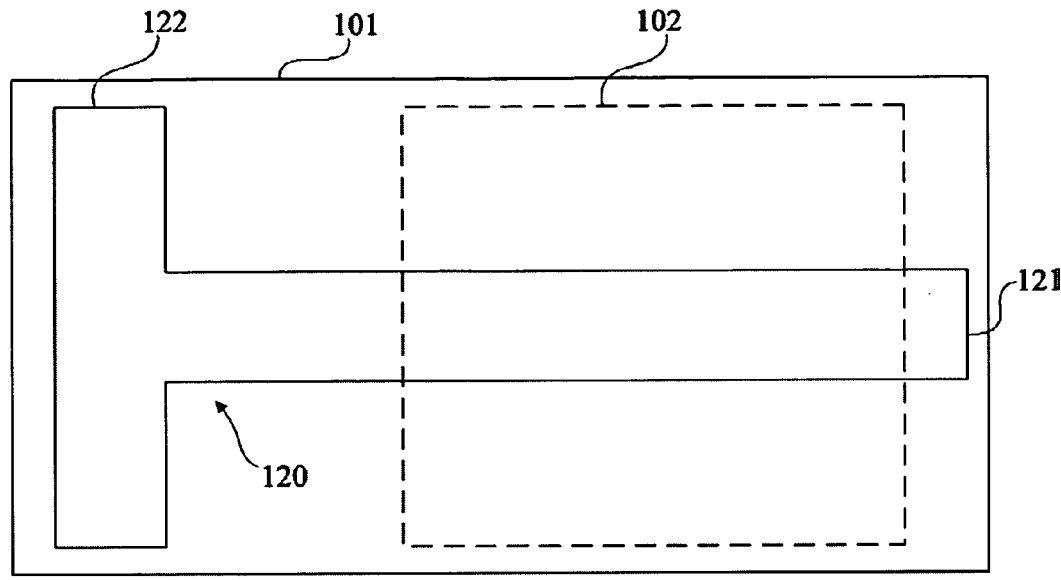
Figure 6B:
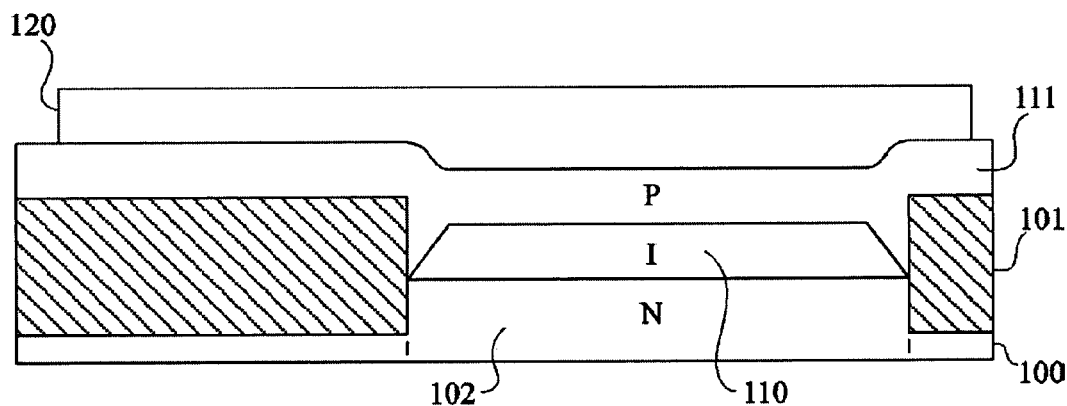

In a next step, illustrated in top view in FIG. 6A and in cross-section view in FIG. 6B, a resin layer is deposited on the previously-obtained structure, after which it is insolated and developed to keep an etch mask 120. As visible in FIG. 6A, etch mask 120 is in this example formed of two strips arranged as a T. One strip 121 is placed above active area 102 substantially transversely thereto, so that two substantially rectangular portions of active area 102 are placed on either side of strip 121 in top view. The other strip 122 is placed above insulating area 101 placed against the end of strip 121. As visible in FIG. 6B, etch mask 120 is placed above semiconductor layer 111, and extends from left to right, above the portion of insulating area 101 visible to the left of the drawing, above active area 102, and above the portion of insulating area 101 visible to the right of the drawing.

Figure 7A:
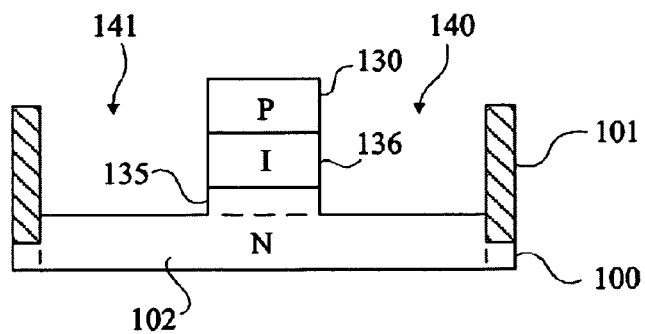

In a next step, illustrated in cross-section view in FIG. 7A and in perspective view in FIG. 7B, an anisotropic etching of semiconductor layer 111 is performed. A so-called "upper" semiconductor area 130 having substantially the same shape as resin mask 120 is then obtained. Intrinsic block 110 and a surface portion of active area 102 are thus etched. Only the upper portion of active area 102 is etched and an N-type strip 135 is formed on top of active area 102. As visible in FIG. 7B, a stacking of an N-type strip 135, of an "intrinsic" strip 136, and of a P-type strip 137 is obtained. Apart from strip 137, upper semiconductor area 130 is formed of a strip 138 placed above insulating area 101 against the end of strip 137. In this example of embodiment, two cavities 140 and 141 are then obtained on either side of the stacking of strips 135 to 137, the bottom of each of cavities 140 and 141 corresponding to a portion of the upper surface of active area 102. Resin mask 120 is then eliminated.

Figure 8A:
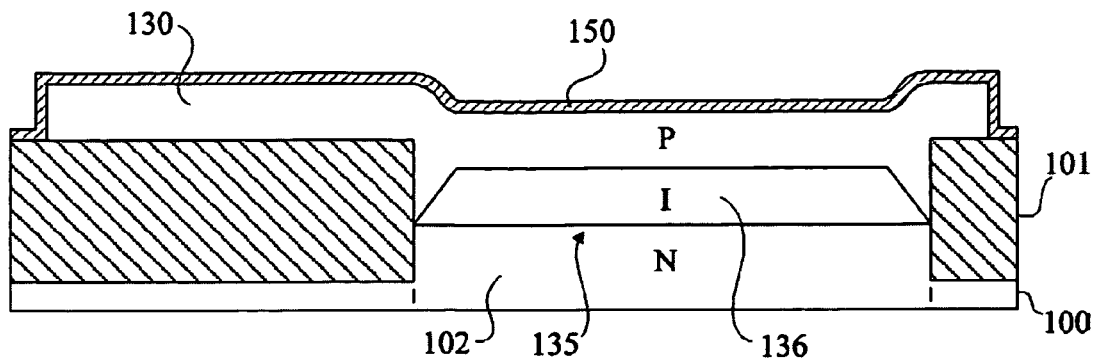
Figure 8B:
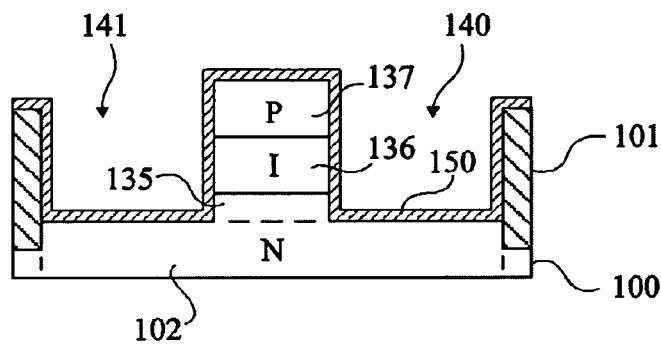

In a next step, illustrated in two perpendicular cross-section views in FIGS. 8A and 8B, a thin insulating layer 150, for example formed of silicon oxide, is conformally deposited. As visible in FIG. 8A, upper semiconductor area 130 is entirely covered with thin insulating layer 150. Similarly, as visible in FIG. 8B, thin insulating layer 150 covers the walls and the bottom of cavities 140 and 141 and surrounds the stacking of strips 135 to 137.

Figure 9A:
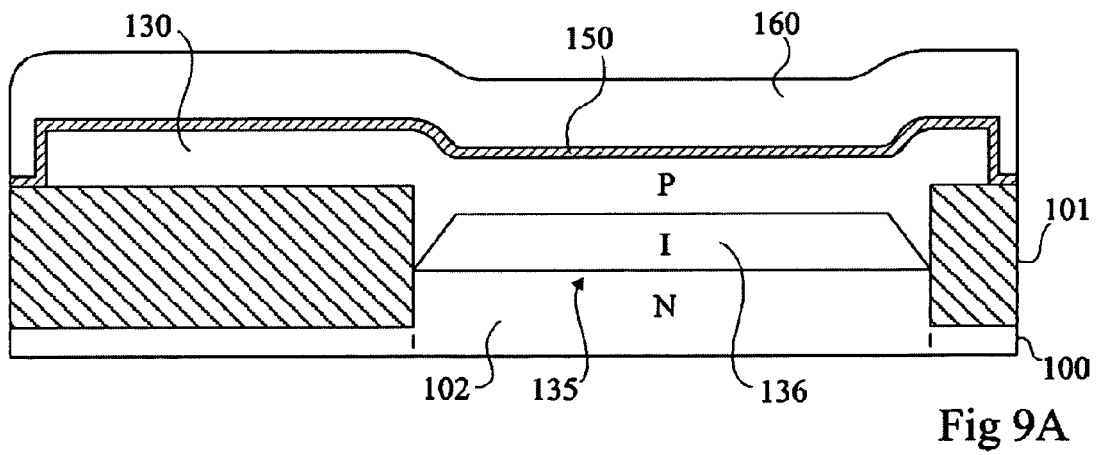
Figure 9B:
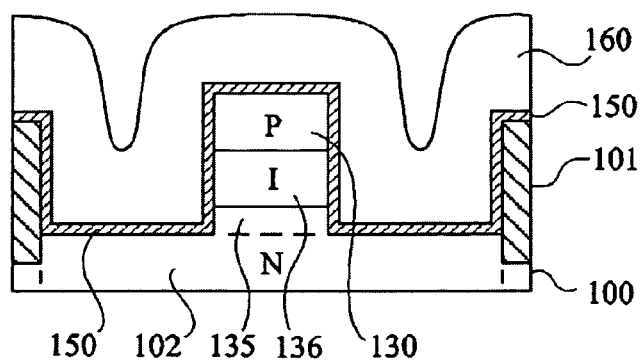

In a next step, illustrated in two perpendicular cross-section views in FIGS. 9A and 9B, a conductive layer 160, for example, polysilicon, is conformally deposited on the previously-obtained structure. As visible in FIG. 9A, conductive layer 160 covers upper area 130. Further, as visible in FIG. 9B, conductive layer 160 "comes down" along the vertical wall of cavity 141, rises back along the vertical wall of the stacking of strips 135 to 137, covers this stack, "comes back down" along the other wall of this stacking, then rises back up along the vertical wall of cavity 140.

Figure 10A:
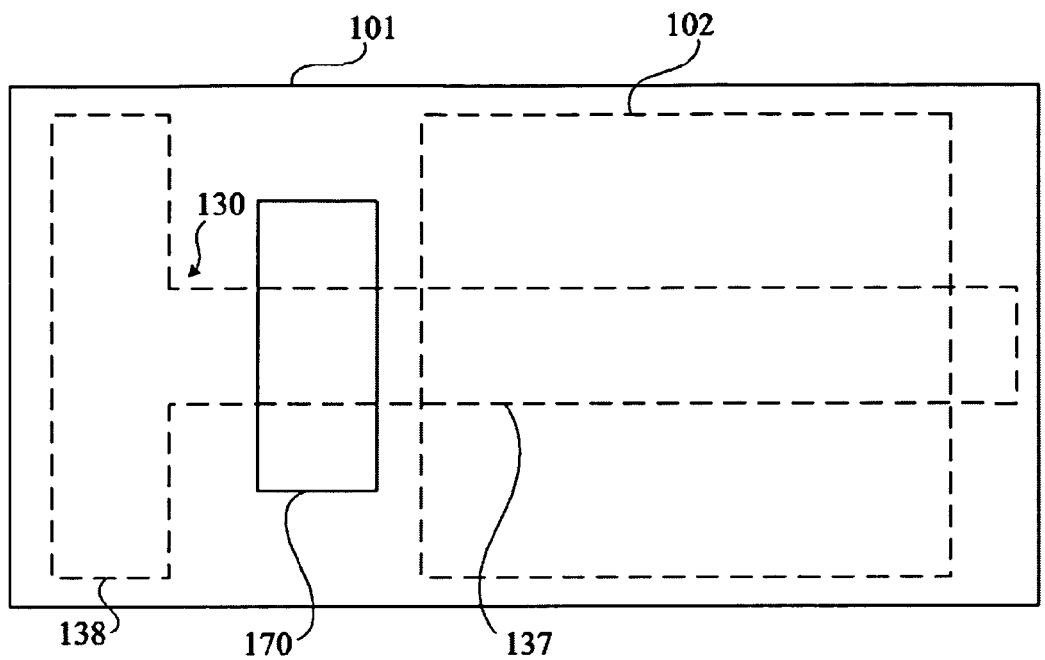
Figure 10B:
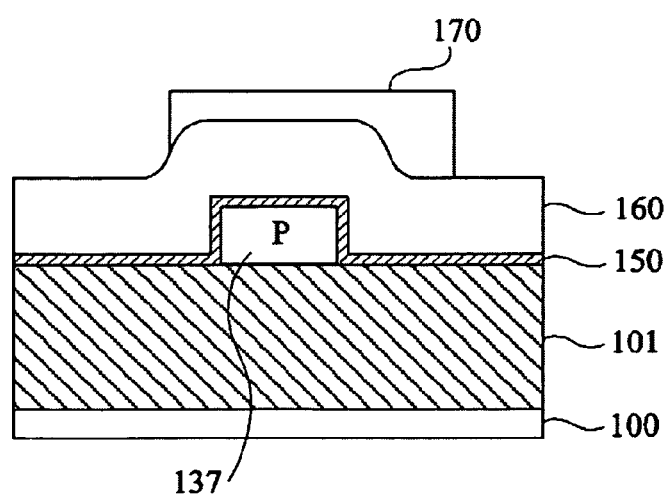

In a next step, illustrated in top view in FIG. 10A and in cross-section view in FIG. 10B, a resin layer which is insolated and developed to keep an etch mask 170 above the previously-obtained structure is deposited. As visible in FIG. 10A, etch mask 170 is in this example a strip placed above insulating area 101 transversely to strip 137 of upper area 130. As visible in FIG. 10B, etch mask 170 is placed above strip 137. Mask 170 extends slightly to the left of strip 137 and further to the right thereof.

Figure 11:
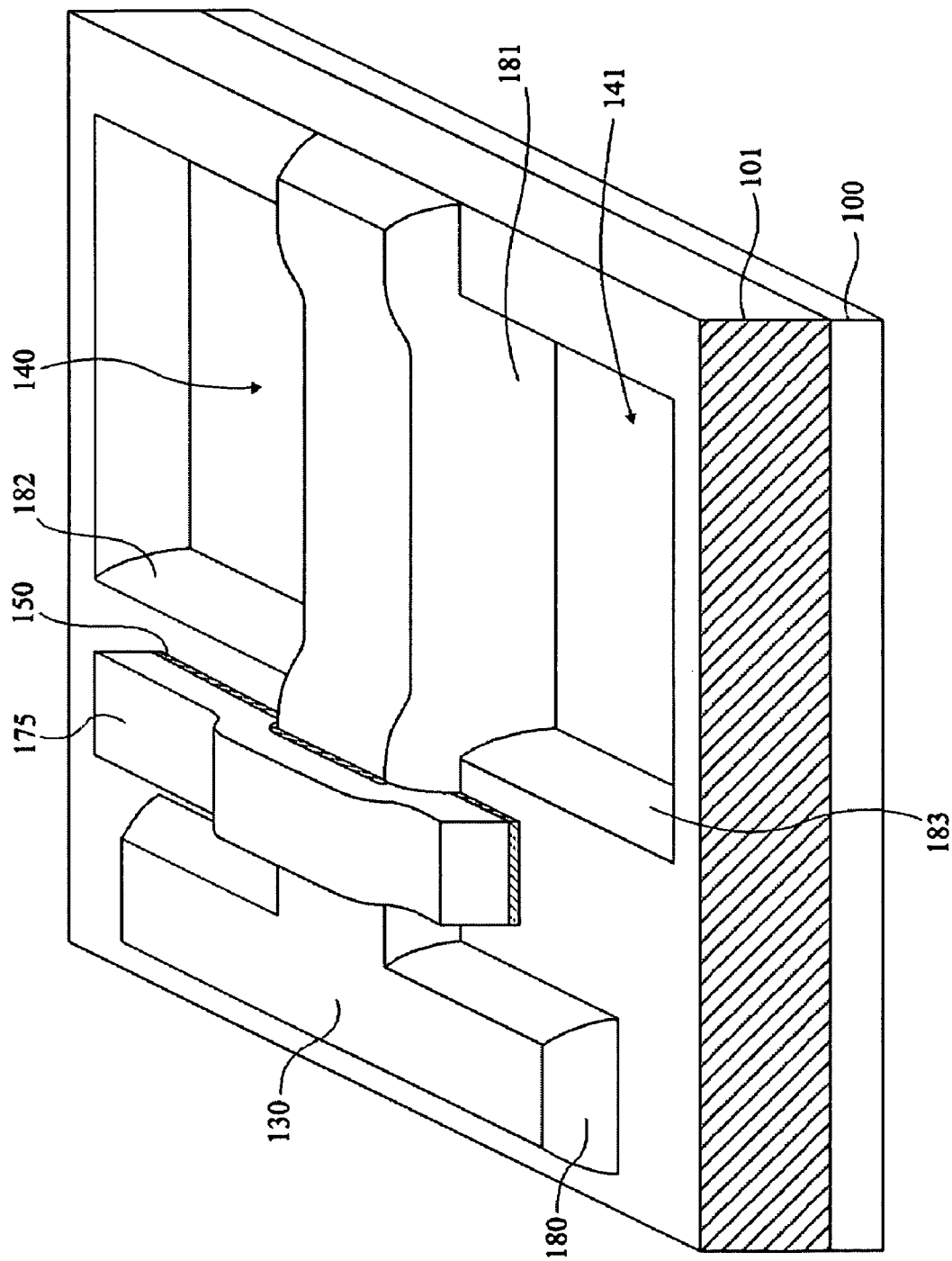

In a next step, illustrated in perspective view in FIG. 11, conductive layer 160 is anisotropically etched. The uncovered portions of thin insulating layer 150 are then eliminated, after which etch mask 170 is eliminated. A conductive strip 175 having the shape of resin mask 170, which surrounds strip 137 and extends transversely thereto above insulating area 101, is then obtained. Further, conductive spacers 180, 181, 182, and 183 form against the sides respectively of upper semiconductor area 130, of the stacking of strips 135 to 137, of the vertical walls of cavities 140 and 141. Conductive strip 175 and spacers 181 are insulated from upper semiconductor area 130 and from strips 135 to 137 with remaining portions of thin insulating layer 150. Further, conductive strip 175 is in contact with conductive spacers 180, which are themselves in contact with conductive spacers 181.

Figure 12A:
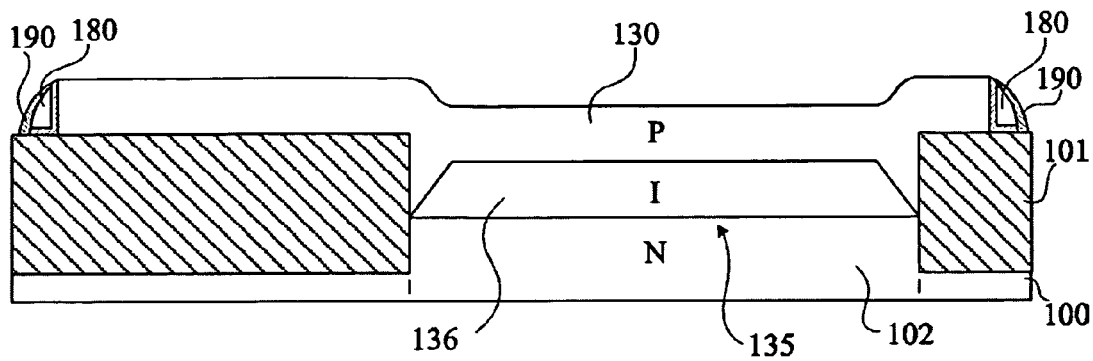
Figure 12B:
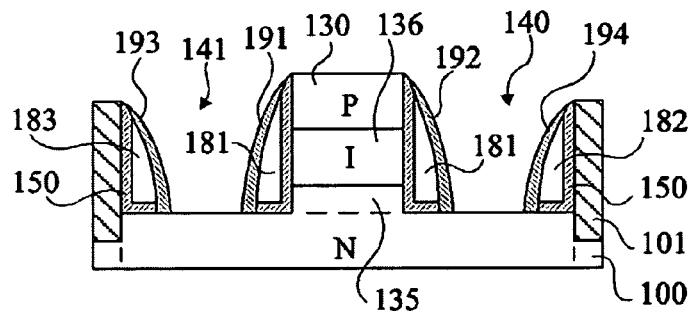

In a next step, illustrated in cross-section views in FIGS. 12A and 12B, an insulating layer is conformally deposited on the previously-obtained structure, after which this insulating layer is anisotropically etched. As visible in FIG. 12A, conductive spacers 180 placed against the vertical walls of upper semiconductor area 130 are then covered with insulating spacers 190. Further, as visible in FIG. 12B, insulating spacers 191, 192 form against conductive spacers 181 placed against the walls of the stacking of strips 135 to 137, and insulating spacers 193 and 194 form against conductive spacers 182 and 183 placed against the walls of cavities 140 and 141.

Figure 13:
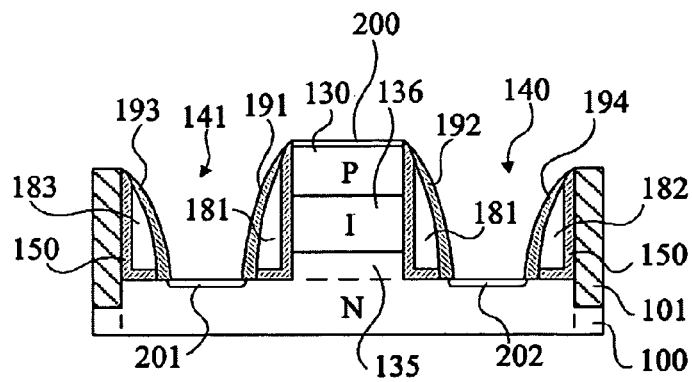

In a next step, illustrated in cross-section view in FIG. 13, a layer of a conductive material, such as cobalt, is deposited on the previously-obtained structure and this conductive layer is made to react with the exposed portions of the semiconductor areas, that is, the exposed portions of active area 102 and of upper semiconductor area 130. Silicided SiCo areas 200, 201, 202 then form at the surface of these semiconductor areas.

Figure 14A:
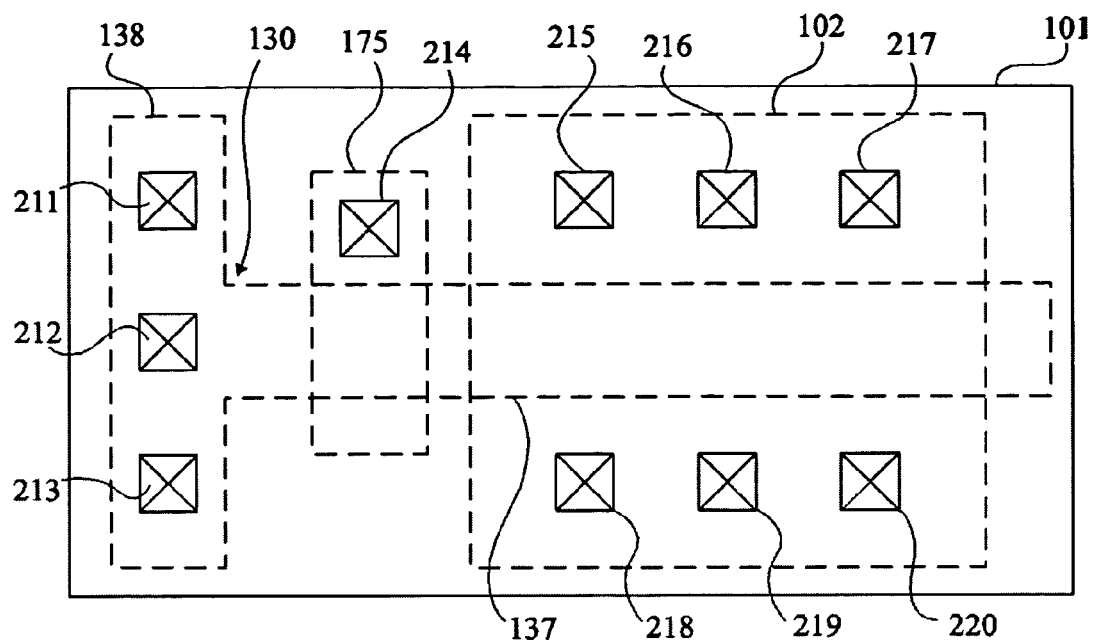
Figure 14B:
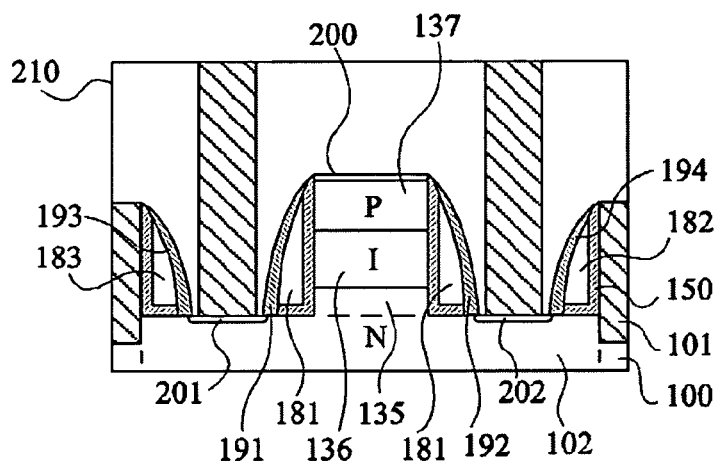
Figure 14C:
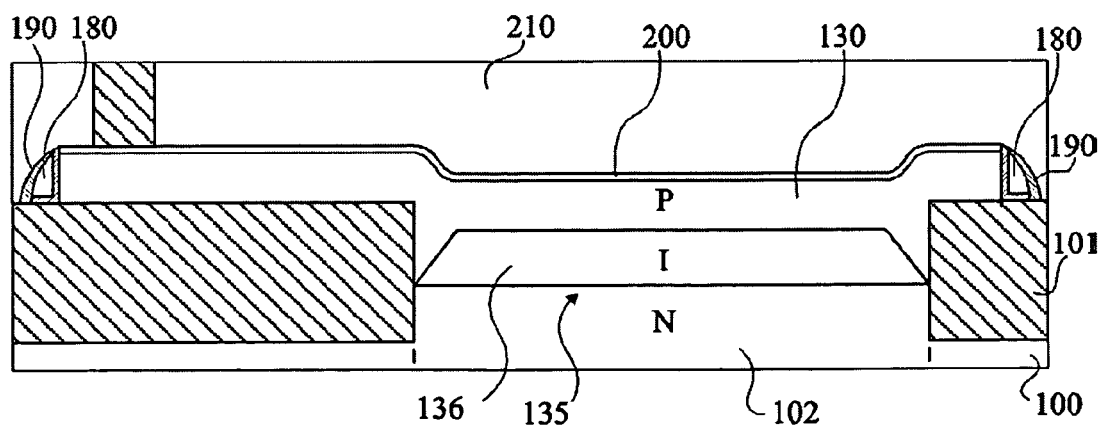

In a next step, illustrated in top view in FIG. 14A, and in two cross-section views in FIGS. 14B and 14C, an insulating layer 210 is non-conformally deposited on the previously-obtained structure. Insulating layer 210 is then etched to form through openings, after which these openings are filled with a conductive material such as aluminum or copper. A set of contacts has thus been formed. On the top view shown in FIG. 14A, contacts are each represented by a square filled with a cross. In this example, three contacts 211, 212, 213 are placed above strip 138 of upper semiconductor area 130, a contact 214 is placed above the end of conductive strip 175, and three contacts 215, 216, 217, and 218, 219, 220 are placed in each of cavities 140 and 141 above silicided areas 201 and 202.

As visible in FIG. 14B, contacts placed in cavities 140 and 141 are placed between insulating spacers 193/191 and 192/194, above silicided areas 201 and 202.

Further, as visible in FIG. 14C, no contact is placed above strip 137 of upper area 130. Only 3 contacts are placed above strip 138 of upper area 130. This is due to the fact that strip 138 may be very narrow and that it is then impossible to place contacts above this strip. Strip 137 is then provided to be sufficiently wide to be able to "welcome" contacts. The width of strip 138 is provided to be wider or narrower according to the current capacities desired for the IMOS transistor.

According to an alternative embodiment of the method according to the present invention, substrate 100 is the upper semiconductor layer of an SOI-type wafer. In this case, insulating area 101 is formed in through openings of the semiconductor layer to be in contact with the thin insulating layer of the SOI wafer separating the semiconductor layer from the support layer of the SOI wafer.

As visible in FIG. 14B, an IMOS transistor according to the present invention comprises a stack of three semiconductor portions 135, 136, 137 forming a vertical PIN diode as well as a conductive gate 181, formed for example of conductive spacers, placed against the vertical walls of the stacking, a thin insulating layer 150 being placed between the stacking and the gate. Lower semiconductor portion 135 is doped with dopant elements of a first type, for example, N. Intermediary semiconductor portion 136 is undoped, or intrinsic I. Upper semiconductor portion 137 is doped with dopant elements of a second type, for example, P. The conductive gate spacers are connected to a gate terminal G and the lower and upper portions of the stacking, N- or P-doped, are connected to source and drain terminals S and D.

Lower semiconductor portion 135 is for example in contact with a wider semiconductor area of the same doping type, or access area 102, since the access to the lower portion is then performed via this area and a contact placed above portions of the access area uncovered with lower portion 135. The access area may be a doped area of a semiconductor wafer that may be doped with dopant elements of another type, or a portion of the upper semiconductor layer of an SOI-type wafer. It is considered in the present description that a semiconductor wafer or a semiconductor layer generally forms a substrate.

Whatever the used type of substrate, it is often necessary to insulate the IMOS transistor from other components formed in the substrate. For this purpose, an insulating area 101 is placed in an opening of the substrate formed around the access area.

Further, the presence of such an insulating area enables providing an extension of the upper portion of the stacking above this insulating area. Such an extension is useful when the upper portion is narrow and when it is difficult to place sufficiently wide contacts above this upper portion. This extension is then provided to be long enough to "welcome" contacts which enable access to the upper portion of the PIN diode.

Further, to enable access to the transistor gate, conductive gate spacers 181 are in contact with a sufficiently wide conductive block on which it is possible to place contacts. Such a conductive block may be formed in various ways. This is for example a block 175 placed on the insulating area in contact with conductive spacers covering the walls of the extension of the upper portion, such conductive spacers forming an extension of the conductive gate spacers. It may also be provided to place a conductive block immediately against the conductive gate spacers above the access area, by placing an insulating layer between the block and the access area. Such a block may also be placed partly above the insulating area and partly above the access area.

An advantage of the vertical IMOS transistor according to the present invention is that it takes up a smaller surface area than a horizontal transistor for an identical current capacity.

As a non-limiting guide, the dimensions of an IMOS transistor obtained according to the present invention and such as shown in FIGS. 14A to 14C are the following:

Minimum/maximum width of strip 137: 100 nm,
Width of strip 138: 200 nm,
Width of a contact: 120 nm,
Thickness of P strip 137: 25/50 nm,
Thickness of intrinsic strip 136: 25/30 nm,
Thickness of N strip 135: 10/30 nm,
Width of cavities 140, 141: 100 nm,
Initial depth of active N area 102: 30 nm,
Width of conductive strip 175: 200 nm,
Thickness of thin insulating layer 150: 15 angstroms.

The IMOS transistor according to the present invention may be used as an N-channel (NMOS) or P-channel (PMOS) MOS transistor. When it is desired to have the equivalent of an NMOS transistor, the opposite P and N doped portions of the PIN diode are respectively used as a source and as a drain. Conversely, when it is desired to have the equivalent of a PMOS transistor, the P or N doped portions of the PIN diode are respectively used as a drain and as a source.

Of course, the present invention is likely to have various alterations, modifications, and improvements which will readily occur to those skilled in the art. In particular, those skilled in the art may devise other methods for manufacturing a transistor according to the present invention.

Further, various alternative embodiments of a transistor according to the present invention may be provided. The conductive gate placed against the stacking of the doped and intrinsic portions may be provided to be thinner than this stacking and be placed against all or part of the intrinsic portion by possibly extending against all or part of one of the doped portions.

Further, an IMOS transistor in which the stacking of the doped and intrinsic portions of the PIN diode is placed against the insulating area may for example be formed, only one side of the stacking being covered with a conductive spacer of the gate. A vertical IMOS transistor in which the lower portion of the PIN diode is placed on a conductive area other than a semiconductor area may also be provided.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A vertical IMOS-type transistor comprising:
  a conductive access area placed in a upper part of a substrate and surrounded with an insulating area;
  a stack of a first semiconductor portion doped with dopant elements of a first type, of a second substantially undoped intrinsic semiconductor portion, and of a third semiconductor portion doped with dopant elements of a second type forming a PIN-type diode, the stack being placed on the conductive access area, said third portion being placed on the top of the stack and partly disposed on top of said insulating area to form an extension;
  a conductive gate placed against said stack with an interposed insulating layer; and
  at least one first contact electrically connected to the extension providing access to said third portion to form the vertical IMOS-type transistor.

2. The transistor of claim 1, wherein the substrate is a semiconductor wafer or an upper semiconductor layer of an SOI wafer.

3. The transistor of claim 1, wherein said gate is formed of at least one gate spacer.

4. The transistor of claim 1, further comprising at least one second contact placed above a portion of said access area.

5. The transistor of claim 3, wherein said access area has a substantially rectangular shape, said third portion is formed of first and second strips forming a T, a first strip being placed above the access area, transversely thereto, so that in top view two portions of the access area are placed on either side of this first strip, first strip extending over said insulating area, the second strip being placed above said insulating area against one end of the first strip, first gate spacers being placed against said stack above said conductive access area and second gate spacers being placed against parts of the third portion placed above insulating area, and further comprising a third conductive strip surrounding said first strip and laterally extending above the insulating area, the third strip being in contact with said second gate spacers.

6. The transistor of claim 1, wherein said conductive gate does not extend from the bottom to the top of said stack, the gate being placed against all or part of the second intrinsic semiconductor portion and possibly extending against all or part of one of the first and third doped semiconductor portions.

7. A vertical IMOS-type transistor comprising:
  a conductive area surrounded by an insulating area;
  a stack of a first semiconductor portion doped with dopant elements of a first type, of a second substantially undoped intrinsic semiconductor portion, and of a third semiconductor portion doped with dopant elements of a second type, said third portion being placed on the top of the stack, the stack placed on the conductive area and said third portion is partly disposed on top of said insulating area to form an extension;
  a conductive gate connected to said stack; and
  at least one contact electrically connected to the extension providing access to said third portion to form the vertical IMOS-type transistor.

8. The transistor of claim 7, wherein the stack forms a PIN diode.

9. The transistor of claim 7, wherein the conductive gate is placed against said stack with an interposed insulating layer.

* * * * *